US009231198B2

(12) United States Patent
Hwang et al.

(10) Patent No.: US 9,231,198 B2
(45) Date of Patent: Jan. 5, 2016

(54) RESISTANCE-VARIABLE MEMORY DEVICE INCLUDING CARBIDE-BASED SOLID ELECTROLYTE MEMBRANE AND MANUFACTURING METHOD THEREOF

(75) Inventors: Hyun-Sang Hwang, Gwangju (KR); Myeong-Bum Pyun, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 116 days.

(21) Appl. No.: 13/120,547

(22) PCT Filed: Sep. 22, 2009

(86) PCT No.: PCT/KR2009/005379
§ 371 (c)(1),
(2), (4) Date: Mar. 23, 2011

(87) PCT Pub. No.: WO2010/036001
PCT Pub. Date: Apr. 1, 2010

(65) Prior Publication Data
US 2011/0175052 A1    Jul. 21, 2011

(30) Foreign Application Priority Data

Sep. 23, 2008  (KR) .................. 10-2008-0093399

(51) Int. Cl.
*H01L 45/00* (2006.01)
(52) U.S. Cl.
CPC .......... *H01L 45/085* (2013.01); *H01L 45/1233* (2013.01); *H01L 45/149* (2013.01); *H01L 45/1625* (2013.01); *H01L 45/1683* (2013.01); *G11C 2213/35* (2013.01)
(58) Field of Classification Search
CPC .............. H01L 45/149; H01L 45/1625; H01L 45/1233; H01L 45/085; H01L 45/1683
See application file for complete search history.

(56) References Cited

U.S. PATENT DOCUMENTS

| 2005/0167699 | A1* | 8/2005 | Sugita et al. ............... 257/202 |
| 2006/0022347 | A1* | 2/2006 | Campbell .................. 257/762 |
| 2006/0209495 | A1* | 9/2006 | Lee et al. .................. 361/502 |
| 2008/0075843 | A1* | 3/2008 | Kuh et al. .................. 427/125 |
| 2009/0057644 | A1* | 3/2009 | Shin et al. ..................... 257/4 |
| 2009/0087570 | A1* | 4/2009 | Kawata et al. ............ 427/383.1 |
| 2011/0175052 | A1* | 7/2011 | Hwang et al. ................... 257/4 |

FOREIGN PATENT DOCUMENTS

| KR | 10-0682908 B1 | 2/2007 |
| KR | 10-2007-0075812 A | 7/2007 |
| KR | 10-0785021 B1 | 12/2007 |
| KR | 10-2008-0066474 A | 7/2008 |
| KR | 10-2010-0034331 | * 4/2010 |

OTHER PUBLICATIONS

Merriam Webster OnLine definition of membrane.*
(Continued)

*Primary Examiner* — Hrayr A Sayadian
(74) *Attorney, Agent, or Firm* — Osha Liang LLP (57) ABSTRACT

Disclosed are a resistance-variable memory device including a carbide-based solid electrolyte membrane that has stable memory at a high temperature and a manufacturing method thereof. The resistance-variable memory device includes: a lower electrode, the carbide-based solid electrolyte membrane arranged on the lower electrode, and an upper electrode arranged on the solid electrolyte membrane. In addition, the method for manufacturing the resistance-variable memory device comprises: a step for forming the lower electrode on a substrate, a step for forming the carbide-based solid electrolyte membrane on the lower electrode, and a step for forming the upper electrode on the solid electrolyte membrane.

9 Claims, 10 Drawing Sheets

(56) References Cited

OTHER PUBLICATIONS

Merriam Webster OnLine definition of "membrane."*
English Machine translation of 10-2010-0034331 Machine. Apr. 2010.*
International Search Report w/translation from PCT/KR2009/005379 dated Apr. 28, 2010 (4 pages).
Written Opinion from PCT/KR2009/005379 dated Apr. 28, 2010 (3 pages).
Korean Intellectual Property Office Abstract Publication No. 1020080066474A dated Jul. 16, 2008 (1 page).
Korean Intellectual Property Office Abstract Publication No. 100785021B1 dated Dec. 5, 2007 (1 page).
Korean Intellectual Property Office Abstract Publication No. 1020070075812A dated Jul. 24, 2007 (1 page).
Korean Intellectual Property Office Abstract Publication No. 1020060070694A dated Jun. 26, 2006 (1 page).

* cited by examiner

RESISTANCE-VARIABLE MEMORY DEVICE INCLUDING CARBIDE-BASED SOLID ELECTROLYTE MEMBRANE AND MANUFACTURING METHOD THEREOF

TECHNICAL FIELD

The present invention relates to a non-volatile memory device and, more particularly, to a resistance-variable memory device including a carbide-based solid electrolyte membrane and a manufacturing method thereof.

BACKGROUND ART

A resistive random access memory (ReRAM) device, which has been studied since 1960s, has a metal-insulator-metal (MIM) structure using a metal oxide and exhibits memory switching characteristics in which a low conductivity state due to high resistance switches to a high conductivity state due to low resistance when an electrical signal is applied.

The ReRAM device has a fast access time and a low power consumption as it can operate even at a low voltage. Moreover, the ReRAM device can provide fast read and write speeds and reduce the probability of failure during manufacturing process due to a simple storage device structure, thereby reducing the manufacturing cost.

Among these ReRAM devices, a device including a sulfide-based solid electrolyte membrane has problems such as low switching voltage, fast ion mobility, etc., and thus exhibits unstable memory characteristics at high temperature.

DISCLOSURE

Technical Problem

An object of the present invention to solve the aforementioned problems is to provide a resistance-variable memory device having stable memory characteristics at high temperature and a method of manufacturing the same.

Technical Solution

The present invention for achieving the above objects provides a resistance-variable memory device comprising: a lower electrode; a carbide-based solid electrolyte membrane disposed on the lower electrode; and an upper electrode disposed on the solid electrolyte membrane.

The carbide-based solid electrolyte membrane may be a CuC layer, an AgC layer, or an AuC layer, and the carbide-based solid electrolyte membrane may be an amorphous layer. The upper electrode may be a Pt layer, a Ru layer, an Ir layer, an Al layer, a Ti layer, a Cu layer, or a Ni layer, and the lower electrode may be a Pt layer, a Ru layer, an Ir layer, or an Al layer. The resistance-variable memory device may further comprise an insulating layer formed on the lower electrode and having a contact hole partially exposing the lower electrode, and the insulating layer may be a $SiO_2$ layer.

The present invention for achieving the above objects provides a method of manufacturing a resistance-variable memory device, the method comprising: forming a lower electrode on a substrate; forming a carbide-based solid electrolyte membrane on the lower electrode; and forming an upper electrode on the solid electrolyte membrane.

The method of manufacturing the resistance-variable memory device may further comprise, before the forming of the solid electrolyte membrane, forming an insulating layer on the lower electrode, the insulating layer having a contact hole partially exposing the lower electrode.

The solid electrolyte membrane may be formed using a sputtering method.

Advantageous Effects

As described above, the resistance-variable memory device including the carbide-based solid electrolyte membrane can increase switching voltage by reducing the conductivity of ions in the solid electrolyte membrane and ensure stable memory characteristics at high temperature.

MODE FOR INVENTION

The present invention can be variously modified and have several embodiments, and some embodiments are illustrated in the accompanying drawings and will be described in detail in the specification.

However, the present invention is not limited to the specific embodiments and should be construed as including all the changes, equivalents, and substitutions included in the spirit and scope of the present invention.

Hereinafter, preferred embodiments of the present invention will be described with reference to the accompanying drawings. In the following description and drawings, the same reference numerals are used for the same components, and repeated description thereof will be omitted.

Next, the preferred embodiments of the present invention will be described in detail with reference to the accompanying drawings.

Figure 1:
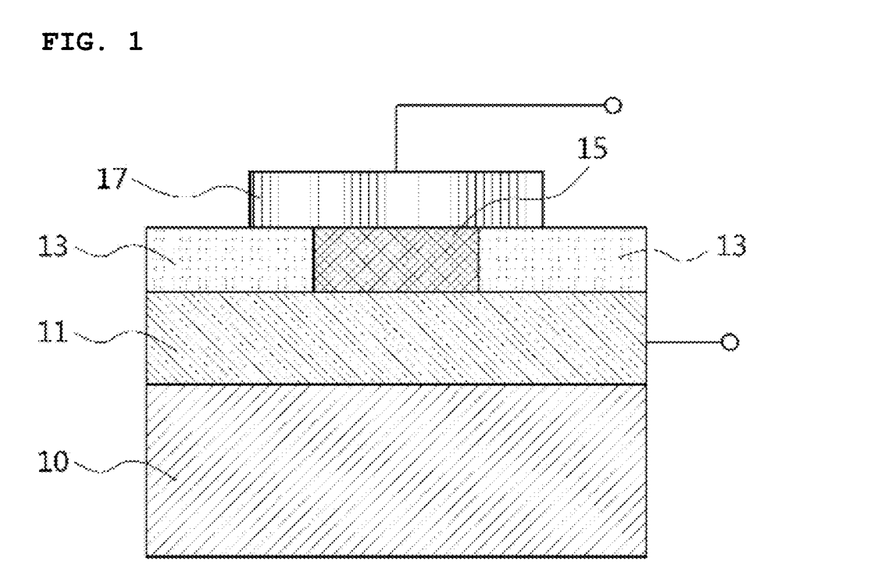
FIG. 1 is a cross-sectional view showing a resistance-variable memory device according to one embodiment of the present invention.

FIG. 1 is a cross-sectional view showing a resistance-variable memory device according to one embodiment of the present invention.

Referring to FIG. 1, a resistance-variable memory device may comprise a lower electrode 11 disposed on a substrate 10, a solid electrolyte membrane 15 disposed on the lower electrode 11, and an upper electrode 17 disposed on the solid electrolyte membrane 15. The resistance-variable memory device may further comprise an insulating layer 13 formed on the lower electrode 11 and having a contact hole partially exposing the lower electrode 11.

The lower electrode 11 may be a Pt layer, a Ru layer, an Ir layer, or an Al layer. The carbide-based solid electrolyte membrane 15 may be a $Cu_xC$ layer, an $Ag_xC$ layer, or an $Au_xC$ layer. Here, x may be 0.1 to 0.8, and preferably 0.4 to 0.6. The carbide-based solid electrolyte membrane 15 may be an amorphous layer. The upper electrode 17 may be a Pt layer, a Ru layer, an Ir layer, an Al layer, a Ti layer, a Cu layer, or a Ni layer. The insulating layer 13 may be a $SiO_2$ layer.

In the resistance-variable memory device, a conductive filament may be formed in the solid electrolyte membrane 15 by applying a set electric field between the lower electrode 11 and the upper electrode 17. That is, when a positive voltage is applied to the upper electrode 17 with respect to the lower electrode 11 as a reference voltage, metal ions in the solid electrolyte membrane 15 may receive electrons injected from the lower electrode 11 and be reduced to metals as represented by the following formula 1. The reduced metals can form a conductive filament, and the conductive filament can provide a conductive path between the electrodes 11 and 17. As a result, the device may have a set state, i.e., a low resistance state (LRS).

[Formula 1]

On the contrary, when a reset electric field is applied between the lower electrode 11 and the upper electrode 17, that is, when a negative voltage is applied to the upper electrode 17 with respect to the lower electrode 11 as a reference voltage, the metals may be oxidized by the following formula 2. Therefore, the conductive filament formed during the set step can be removed and, as a result, the resistance-variable memory device may have a high resistance state (HRS).

[Formula 2]

The carbide-based solid electrolyte membrane 15 has low ion conductivity, and thus a high voltage is required to form the conductive filament. Therefore, the switching voltage for forming the conductive filament may be increased. As a result, it is possible to prevent the device from erroneously switching due to noise voltage.

FIGS. 2 to 5 are cross-sectional views showing a manufacturing process of a resistance-variable memory device according to one embodiment of the present invention, in which the manufacturing process will be described with respect to a unit cell of the memory device.

Figure 2:
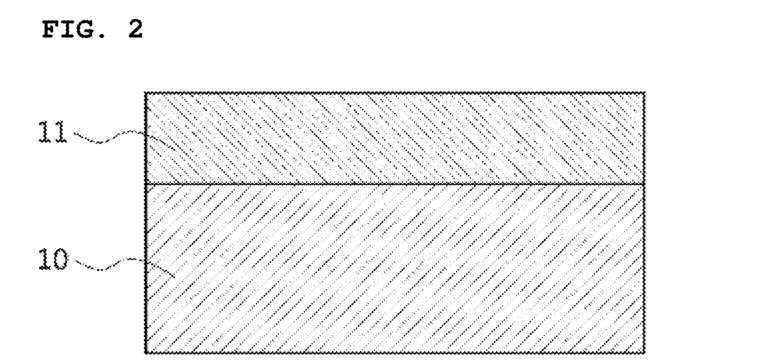
FIGS. 2 to 5 are cross-sectional views showing a manufacturing process of a resistance-variable memory device according to one embodiment of the present invention.

Referring to FIG. 2, a lower electrode 11 is formed on a substrate 10. The substrate 10 may be a silicon substrate or a silicon-on-insulator (SOI) substrate. The lower electrode 11 may be a Pt layer, a Ru layer, an Ir layer, or an Al layer.

Figure 3:
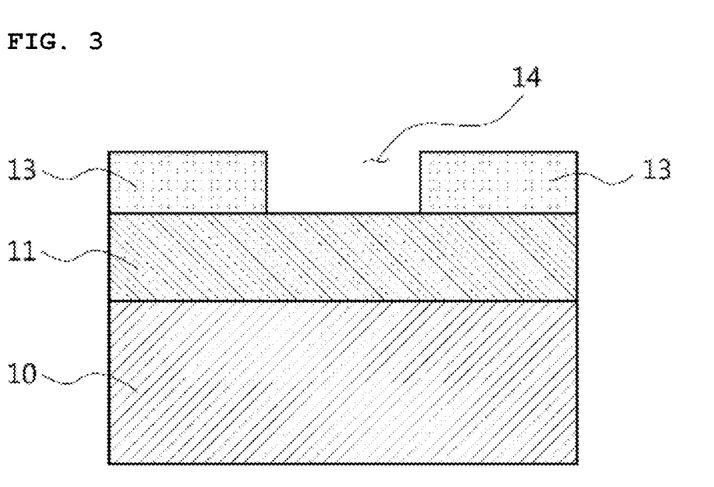

Referring to FIG. 3, an insulating layer 13 having a contact hole 14 is formed on the lower electrode 11. The insulating layer 13 may be a $SiO_2$ layer.

Figure 4:
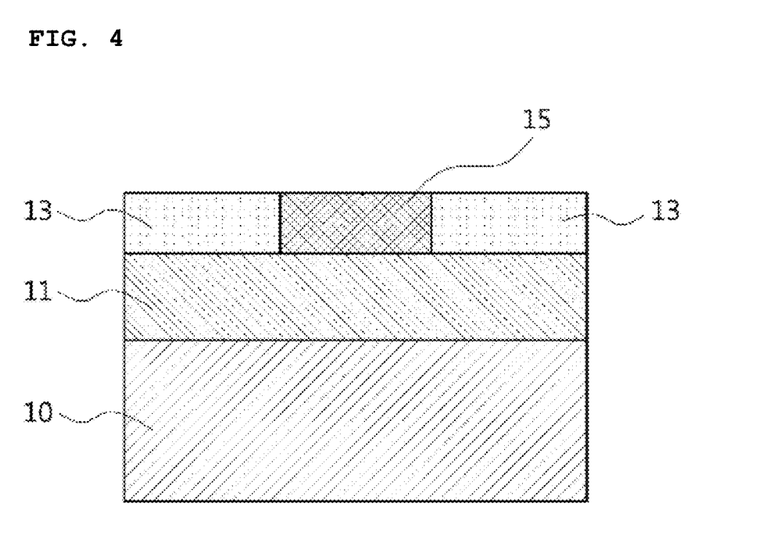

Referring to FIG. 4, a solid electrolyte membrane 15 is formed in the contact hole 14 on the lower electrode 11. The solid electrolyte membrane 15 may be filled in the contact hole 14. The solid electrolyte membrane 15 may be a solid-phase layer having ion conductivity. The solid electrolyte membrane 15 may be an amorphous layer. In detail, the solid electrolyte membrane 15 may be a carbide-based layer. The carbide-based layer may be a CuC layer, an AgC layer, or an AuC layer.

The solid electrolyte membrane 15 may be formed by physical vapor deposition (PVD) such as reactive sputtering, sputtering, pulsed laser deposition (PLD), thermal evaporation, electron-beam evaporation, etc., molecular beam epitaxy (MBE), or chemical vapor deposition (CVD).

Preferably, the reactive sputtering or sputtering may be used. When the CuC layer is formed by the reactive sputtering, Cu may be used as a target, and $CH_4$, Ar and O2 may be used as reactant gases. Each reactant gas may be supplied at 3 sccm, 10 sccm, and 1 sccm, respectively, and the reactant gases may be maintained at 10 mtorr.

Figure 5:
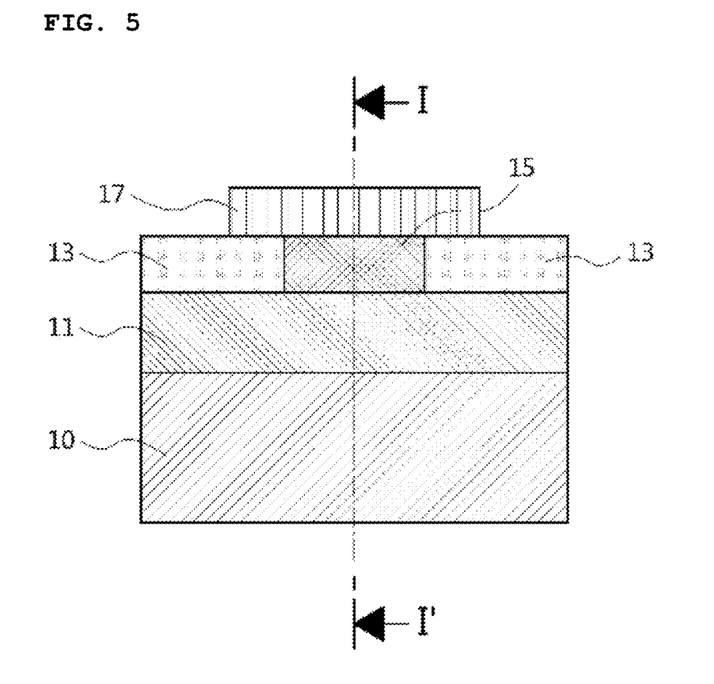

Referring to FIG. 5, an upper electrode 17 is formed on the solid electrolyte membrane 15. The upper electrode 17 may be a Pt layer, a Ru layer, an Ir layer, an Al layer, a Ti layer, a Cu layer, or a Ni layer. The insulating layer 13 may be formed by deposition or etching through lithography.

Next, preferred examples will be provided to facilitate understanding of the present invention. However, the following examples are only for the understanding of the present invention, and the present invention is not limited by the following examples.

EXAMPLE

After forming a Pt layer as a lower electrode, a $SiO_2$ layer as an insulating layer having a contact hole was formed. A CuC layer as a solid electrolyte membrane was formed in the contact hole on the Pt layer by reactive sputtering. To a chamber, Ar was supplied at 10 sccm, $CH_4$ was supplied at 3 sccm, and oxygen was supplied at 1 sccm. At this time, the gases were maintained at an atmospheric pressure of 10 mtorr. Then, a Cu layer as an upper electrode was formed on the CuC layer, thereby manufacturing a resistance-variable memory device.

Figure 6:
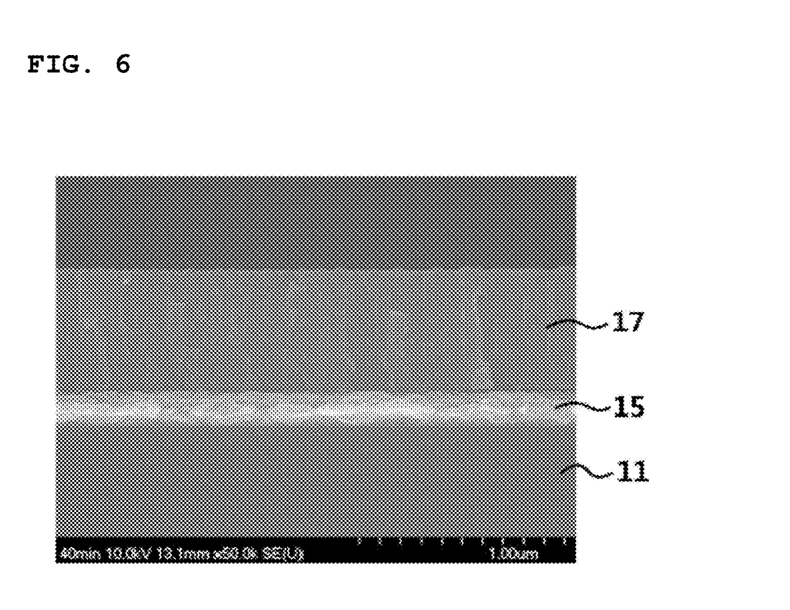
FIG. 6 is an SEM image showing a cross-section of a resistance-variable memory device according to one embodiment of the present invention.

FIG. 6 is an SEM image showing a cross-section of a resistance-variable memory device according to one embodiment of the present invention. The cross-section of the image shown in FIG. 6 corresponds to a cross-section taken along line I-I' of FIG. 5.

Referring to FIG. 6, a Pt layer 11 is formed at the bottom, a Cu layer 17 is formed at the top, and a CuC layer 15 is formed between the Pt layer and the Cu layer.

Figure 7:
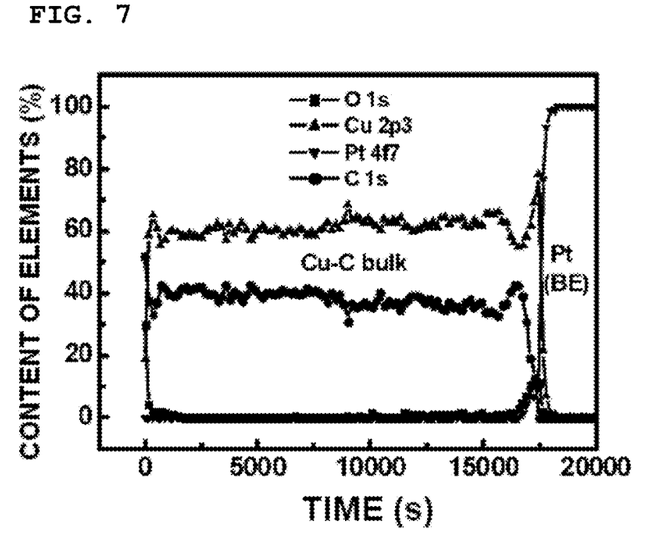
FIGS. 7 and 8 are graphs showing crystallographic characteristics of a resistance-variable memory device according to one embodiment of the present invention.
Figure 8:
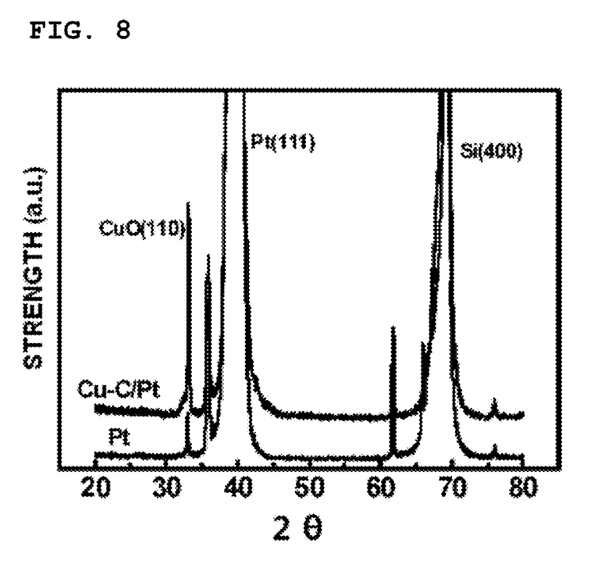

FIGS. 7 and 8 are graphs showing crystallographic characteristics of a resistance-variable memory device according to one embodiment of the present invention. In detail, FIG. 7 shows the content of elements using X-ray photoelectron spectroscopy (XPS), and FIG. 8 shows the crystallinity of the resistance-variable memory device using X-ray diffraction (XRD).

Referring to FIG. 7, elements detected from the resistance-variable memory device were Cu, C, and Pt. It seems that the Pt was detected from the lower electrode and the Cu and C were detected from the solid electrolyte membrane. The content ratio of Cu to C was about 6:4.

Referring to FIG. 8, the peaks of CuO, Si, and Pt formed during manufacturing of the resistance-variable memory were observed, and the peak of CuC was not observed. While the CuC was detected by the XPS analysis in FIG. 7, the CuC was not detected by the XRD analysis in FIG. 8, from which it can be determined that the CuC maintained the amorphous state.

Figure 9:
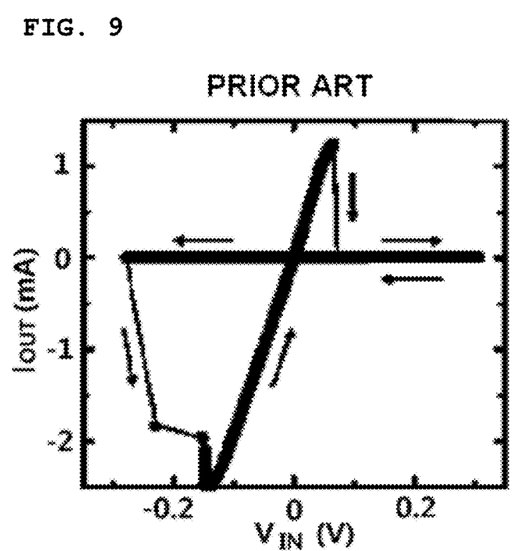
FIG. 9 is a graph showing switching characteristics of a resistance-variable memory device including a solid electrolyte membrane such as a CuS layer according to a prior art.

FIG. 9 is a graph showing switching characteristics of a resistance-variable memory device including a solid electrolyte membrane such as a CuS layer according to a prior art.

Referring to FIG. 9, in the case of the resistance-variable memory device including the solid electrolyte membrane formed using a CuS layer, the switching voltage is about 0.1 V, which is a very low value.

Figure 10:
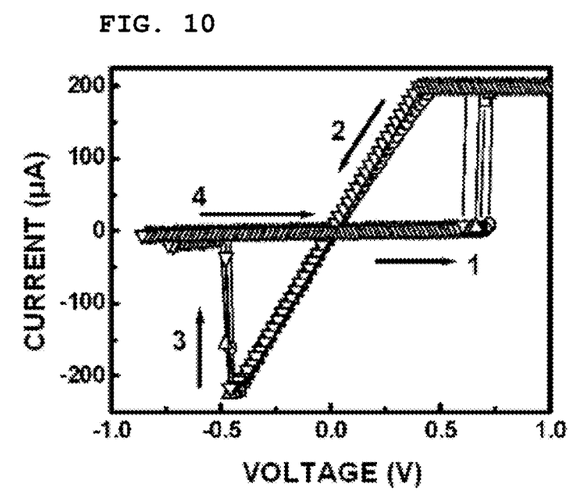
FIG. 10 is a graph showing switching characteristics of a resistance-variable memory device including a solid electrolyte membrane such as a CuC layer according to an Example of the present invention.

FIG. 10 is a graph showing switching characteristics of a resistance-variable memory device including a solid electrolyte membrane such as a CuC layer according to an Example of the present invention.

Referring to FIG. 10, in the case where the CuC layer is used as the solid electrolyte membrane, the switching voltage is about 0.5 V, which exhibits switching voltage characteristics improved more than five times compared to that of FIG. 9. Thereby, it can be seen that the resistance-variable memory device including the carbide-based solid electrolyte membrane has improved switching voltage characteristics.

Figure 11:
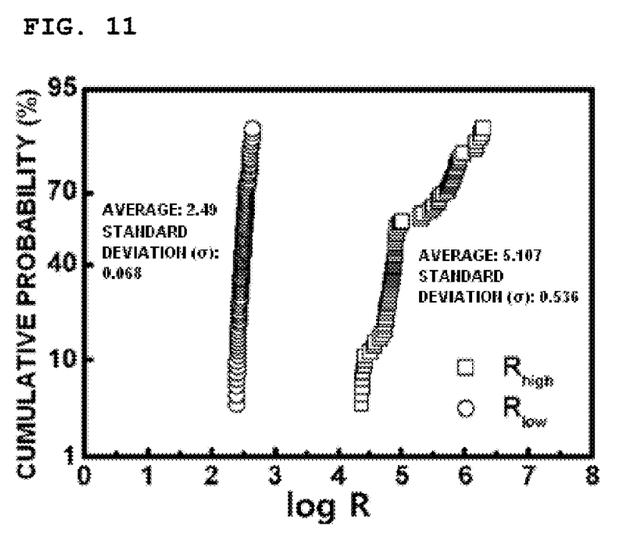
FIG. 11 is a graph showing the distribution of resistances formed in fifty resistance-variable memory devices according to an Example of the present invention.

FIG. 11 is a graph showing the distribution of resistances formed in fifty resistance-variable memory devices according to an Example of the present invention. In detail, after fifty resistance-variable memory devices according to the Example were changed to a low resistance state, the resistances were measured at 100 mV and, after the devices were changed to a high resistance state, the resistances were measured at 100 mV.

Referring to FIG. 11, it can be seen that the log values in the low resistance state exhibited an average value of 2.49 and a standard deviation of 0.068 and the log values in the high resistance state exhibited an average value of 5.107 and a standard deviation of 0.536. Therefore, it was found that the distribution of the resistances in the low resistance state and the distribution of the resistances in the high resistance state were uniform in the plurality of devices.

Figure 12:
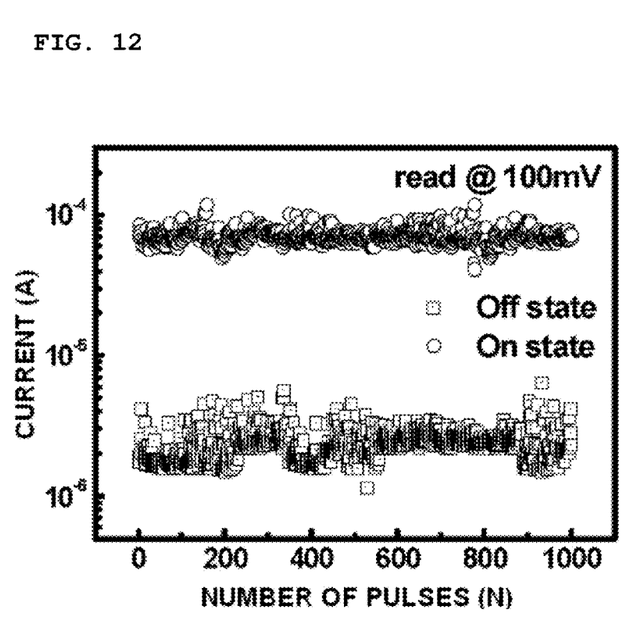
FIG. 12 is a graph showing a change in current with respect to the number of voltage pulses applied to a resistance-variable memory device according to an Example of the present invention.

FIG. 12 is a graph showing a change in current with respect to the number of voltage pulses applied to a resistance-variable memory device according to an Example of the present invention. In detail, after the resistance-variable memory device was changed to a low resistance state and a high resistance state, the resistances were measured at 100 mV.

Referring to FIG. 12, the current value in the high resistance state was about $7 \times 10^{-5}$ and the current value in the low resistance state was about $1 \times 10^{-6}$. Each current value was constant even when the number of pulses was increased to 1,000, from which it can be determined that the reliability of the device was improved.

Figure 13:
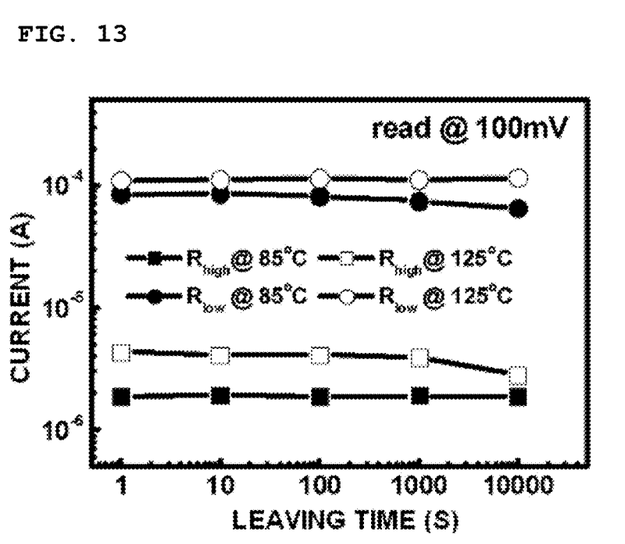
FIG. 13 is a graph showing high-temperature data retention characteristics of a resistance-variable memory device according to an Example of the present invention.

FIG. 13 is a graph showing high-temperature data retention characteristics of a resistance-variable memory device according to an Example of the present invention. In detail, after the resistance-variable memory device according to the Example of the present invention was changed to a low (or high) resistance state, the current was measured and shown after the device was left alone at 85° C. (or 125° C.) for 10 seconds, 100 seconds, 1,000 seconds, and 10,000 seconds, respectively.

Referring to FIG. 13, when the solid electrolyte membrane is formed using the carbide-based layer, the mobility of ions in the solid electrolyte membrane is reduced, which increases the switching voltage, and thus it is possible to ensure stable memory characteristics at high temperature.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

1. A resistance-variable memory device comprising:
a lower electrode;
an insulating layer formed on the lower electrode and having a contact hole exposing the lower electrode;
a carbide-based solid electrolyte membrane disposed on and contacting the lower electrode filling the contact hole,
wherein the carbide-based solid electrolyte membrane is one selected from the group consisting of a $Cu_xC_{1-x}$ layer, an $Ag_xC_{1-x}$ layer, and an $Au_xC_{1-x}$, and
wherein the x ranges from 0.1 to 0.8; and
an upper electrode disposed on and contacting the metal carbide solid electrolyte membrane.

2. The resistance-variable memory device of claim 1, wherein the carbide-based solid electrolyte membrane is an amorphous layer.

3. The resistance-variable memory device of claim 1, wherein the upper electrode is a Pt layer, a Ru layer, an Ir layer, an Al layer, a Ti layer, a Cu layer, or a Ni layer.

4. The resistance-variable memory device of claim 1, wherein the lower electrode is a Pt layer, a Ru layer, an Ir layer, or an Al layer.

5. The resistance-variable memory device of claim 1, wherein the insulating layer is a SiO2 layer.

6. A method of manufacturing a resistance-variable memory device, the method comprising:
forming a lower electrode on a substrate;
forming an insulating layer on the lower electrode, the insulating layer having a contact hole exposing the lower electrode;
forming a carbide-based solid electrolyte membrane on the lower electrode to contact the lower electrode filling the contact hole,
wherein the carbide-based solid electrolyte membrane is one selected from the group consisting of a $Cu_xC_{1-x}$ layer, an $Ag_xC_{1-x}$ layer, and an $Au_xC_{1-x}$ layer, and
wherein the x ranges from 0.1 to 0.8; and
forming an upper electrode on the metal carbide solid electrolyte membrane to contact the metal carbide solid electrolyte membrane.

7. The method of claim 6, wherein the carbide-based solid electrolyte membrane is formed using a sputtering method.

8. The resistance-variable memory device of claim 1, wherein the carbide-based solid electrolyte membrane is the $Cu_xC_{1-x}$ layer, and the content ratio of Cu to C is about 6:4.

9. The method of claim 6, wherein the carbide-based solid electrolyte membrane is the $Cu_xC_{1-x}$ layer and the content ratio of Cu to C is about 6:4.

* * * * *